(12) United States Patent
Di Stefano

(10) Patent No.: US 8,987,891 B2
(45) Date of Patent: Mar. 24, 2015

(54) HEAT SINK APPARATUS FOR MICROELECTRONIC DEVICES

(71) Applicant: Clockspeed, Inc., Monte Sereno, CA (US)

(72) Inventor: Thomas H. Di Stefano, Monte Sereno, CA (US)

(73) Assignee: Centipede Systems, Inc., San Jose, CA (US)

( * ) Notice: Subject to any disclaimer, the term of this patent is extended or adjusted under 35 U.S.C. 154(b) by 0 days.

(21) Appl. No.: 13/783,217

(22) Filed: Mar. 1, 2013

(65) Prior Publication Data

US 2013/0228914 A1    Sep. 5, 2013

Related U.S. Application Data

(60) Provisional application No. 61/606,529, filed on Mar. 5, 2012.

(51) Int. Cl.
| | |
|---|---|
| H01L 23/34 | (2006.01) |
| F28F 3/00 | (2006.01) |
| F28F 3/02 | (2006.01) |
| F28F 3/12 | (2006.01) |
| F28F 13/06 | (2006.01) |

(52) U.S. Cl.
CPC . *F28F 3/00* (2013.01); *H01L 23/34* (2013.01); *F28F 3/022* (2013.01); *F28F 3/12* (2013.01); *F28F 13/06* (2013.01); *H01L 2924/0002* (2013.01)
USPC ......................................... 257/712; 257/714

(58) Field of Classification Search
USPC .................................................. 257/712, 714
See application file for complete search history.

(56) References Cited

U.S. PATENT DOCUMENTS

| | | | |
|---|---|---|---|
| 7,562,617 B2 | 7/2009 | Di Stefano et al. | |
| 7,849,914 B2 | 12/2010 | Di Stefano et al. | |
| 7,870,800 B2 | 1/2011 | Di Stefano et al. | |
| 2007/0256810 A1* | 11/2007 | Di Stefano et al. | 165/46 |
| 2007/0288823 A1* | 12/2007 | Di Stefano et al. | 714/742 |

* cited by examiner

*Primary Examiner* — Khiem D Nguyen
*Assistant Examiner* — Wilner Jean Baptiste
(74) *Attorney, Agent, or Firm* — Michael B. Einschlag

(57) ABSTRACT

One embodiment of the present invention is a heat sink apparatus for cooling a semiconductor device includes: (a) a rigid support ring having a top surface and a bottom surface; (b) a thermally conductive bottom sheet having a top and a bottom surface, wherein the top surface of the sheet is attached to the bottom surface of the rigid support ring; and (c) a channel for cooling fluid formed by a volume contained by the rigid support ring, the sheet, and an enclosure; wherein the sheet is held in tension by the rigid support ring, thereby reducing the macroscopic coefficient of thermal expansion (CTE) of the sheet. In use, thermally induced mechanical stress in a semiconductor device attached to the bottom surface of the sheet may be ameliorated by the reduction in macroscopic CTE, thereby increasing reliability of an assembly as it is cycled in temperature during normal operation.

4 Claims, 9 Drawing Sheets

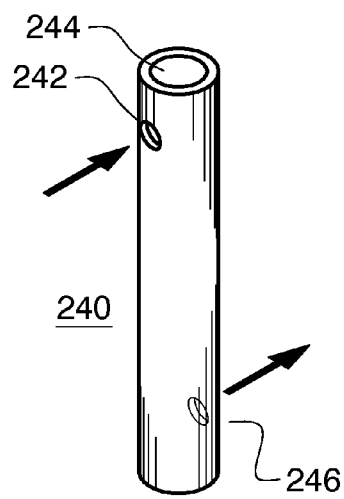
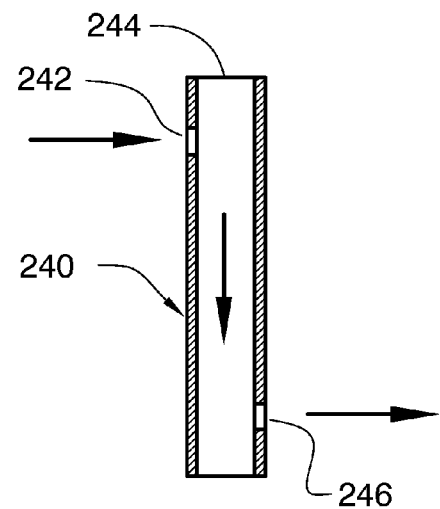
Fig. 5A  Fig. 5B
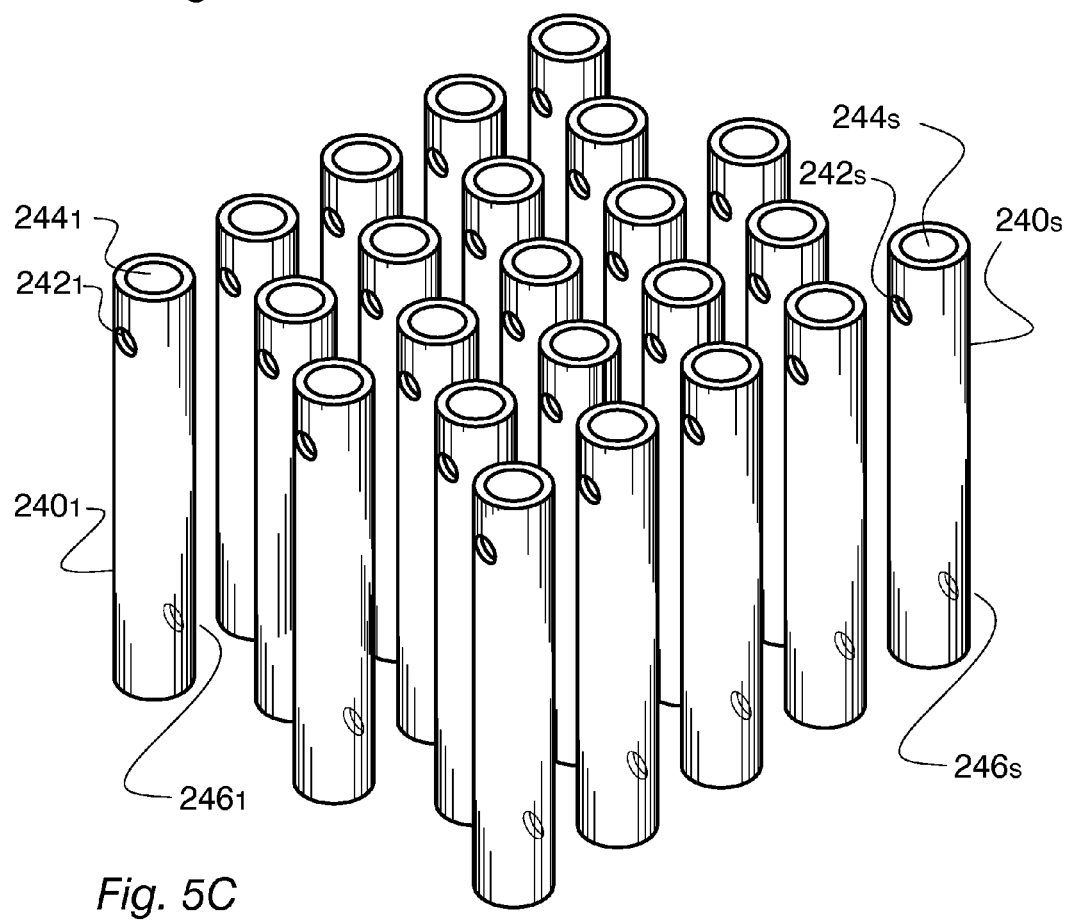
Fig. 5C

HEAT SINK APPARATUS FOR MICROELECTRONIC DEVICES

This patent application relates to U.S. Provisional Application No. 61/606,529 filed Mar. 5, 2012 from which priority is claimed under 35 USC §119(e), and which provisional application is incorporated herein in its entirety.

TECHNICAL FIELD OF THE INVENTION

One or more embodiments of the present invention relate to heat sinking apparatus for microelectronic devices.

BACKGROUND OF THE INVENTION

As semiconductor technology advances, the performance of microelectronic devices such as integrated circuits (also referred to herein as semiconductor chips or chips) increases. Such increased performance, as measured, for example, by clock speed and complexity of chips, has resulted in higher power dissipation of these chips. In addition, device dimensions have reached a point where leakage currents make a significant additional contribution to power dissipation of chips. As a result of these issues, cooling has become an important factor that limits progress in semiconductor electronics.

At present, chip power is limited to approximately 200 watts by the existing ability to cool the chip and maintain chip junction temperatures at an average of about 85° C. This chip power limit of 200 watts is projected by the International Technology Roadmap for Semiconductors to remain static. At present maximum chip sizes of approximately 300 mm² the 200 watt limit corresponds to a thermal flux of approximately 60-70 watts/cm². In addition, recent semiconductor chip designs show further limitation due to hot spots that occur at local regions of the chip, depending upon the circuits being activated.

A standard practice for cooling a high power chip is to attach the chip to a thermally conductive plate (referred to as a heat spreader) using a thermally conductive die attach adhesive, and to attach the heat spreader to a heat sink using a thermally conductive paste or a thermal elastomeric pad. The heat spreader spreads heat generated by the chip to an area larger than that of the chip, and the thermal flux output from the heat spreader to the heat sink is considerably less than that output from the chip to the heat spreader by reason of its having been spread over a larger area (i.e., the larger area of the heat spreader proportionately reduces the thermal flux). Thermal flux output from the heat spreader to the heat sink is conducted relatively efficiently through a thermal paste or thermal pad interposed between the heat spreader and the heat sink. Conventional heat sinks typically include convection cooled fin structures, fan cooled fin structures, and liquid-cooled platens. However, at higher levels of chip power, the above-described standard practice has limitations.

One such limitation with the standard practice is a problem in finding a material for the heat spreader that has a high thermal conductivity and a low coefficient of thermal expansion (CTE). A high thermal conductivity material is needed to spread the thermal flux over a large area to match the area of the heat sink, and a low CTE material is needed so the heat spreader does not induce stress or damage to a chip mounted thereon. For example, copper has a high thermal conductivity of 3.97 watts/cm-° C. and a high CTE of $17.7 \times 10^{-6}$/° C. The large mismatch between the CTE of silicon, i.e., $2.8 \times 10^{-6}$/° C., and the CTE of copper, i.e., $17.7 \times 10^{-6}$/° C., would cause warping and damage to a large chip if it were mounted directly on a copper heat spreader.

Since no inexpensive heat spreader material exists having high thermal conductivity and low CTE, the industry commonly uses a practical compromise in which a material of moderate thermal conductivity and CTE is used for the heat spreader. For example, a copper-tungsten composite material CMC111 available from Tokyo Tungsten Co. Ltd. that is commonly used for the heat spreader exhibits a thermal conductivity of about 2.6 watts/cm-° C. and a CTE of about $9.2 \times 10^{-6}$/° C. In addition to a reduced CTE heat spreader, large chips such as microprocessors require a compliant die attach material be used to attach the chip to the heat spreader to further reduce thermal stress induced on the chip by temperature changes. Compliant die attach materials such as particle filled silicone films, thermally conductive pads, and phase change materials cannot provide the high thermal conductivity of a direct rigid connection. This practical compromise provides limited thermal performance because of the reduced thermal conductivity of the heat spreader and because of the relatively high thermal resistance of compliant die attach materials. The thermal efficiency thus provided is no longer adequate for cooling high performance chips.

The electronics industry has made advances in chip cooling technology to meet demands for more efficient cooling. Many of these advances have been applied to mainframe computer technology, but most remain too costly for general use. One of the more successful approaches is an IBM thermally cooled module (TCM) that uses spring-loaded pistons pressing on chips sealed in a helium filled module. The TCM solves a problem of thermal expansion mismatch by using a piston that slidably contacts the chip surface. Although the TCM is too expensive for general use, the thermal performance is still insufficient for future cooling requirements.

Another approach to improve thermal performance is to use a solid diamond slab as a thermal spreader. The material has a thermal conductivity of about 20 watts/cm-° C. and a low CTE of about $2.3 \times 10^{-6}$/° C. that more closely matches the CTE of silicon. However, the cost of diamond has so far proven prohibitive.

Still another approach to improve thermal performance is to immerse a chip directly in a flow of liquid coolant or refrigerant. Microgrooves on the chip surface provide more efficient thermal transfer of heat from the chip to the liquid. Approaches of this nature are limited by boiling of the liquid, which boiling produces a gas pocket on the chip surface that inhibits efficient thermal transfer. Typical solutions to the problem of boiling entail controlling nucleation of boiling at points on the chip surface. While controlling nucleation of boiling improves thermal transfer, the resulting thermal performance is inadequate to cool high performance chips in the future.

Still another approach to improve thermal performance uses micro-channels etched directly in a chip to provide a larger area for thermal transfer between a cooling liquid and the chip. A spray of liquid coolant on the back of the chip is used in an attempt to reduce the effects of boiling in limiting performance. The cost and technical problems associated with sealing the chip to prevent liquid from leaking onto electronic equipment have limited widespread use of liquid immersion solutions in cooling semiconductor chips. For example, sheets and chip enclosures have been proposed as solutions to the problem of leakage of liquids. Because a thermally conductive sheet typically has a high CTE, the sheet is typically attached to the chip using a compliant or a sliding contact. As in the case of the heat spreader, the compliant attachment material has a relatively high thermal resistance that limits thermal performance of the sheet as a solution to containing liquids used to cool the chip.

In light of the above, there is a need in the art for method and apparatus useful for cooling high performance chips that solve one or more of the above-identified problems to enable the semiconductor industry to progress to smaller and faster chip designs.

SUMMARY OF THE INVENTION

One or more embodiments of the present invention solve one or more of the above-identified problems. In particular, one embodiment of the present invention is an apparatus for cooling a microelectronic device comprising: (a) a rigid support ring having a top surface and a bottom surface; (b) a mechanically resilient, thermally conductive bottom sheet having a top and a bottom surface, wherein the top surface of the sheet is attached to the bottom surface of the ring; and (c) wherein the expansion coefficient of the rigid support ring is less than the thermal expansion coefficient of the sheet. In one or more embodiments of the present invention, a multiplicity of thermally conductive posts are disposed with their bottom surfaces over the top surface of the sheet, and the posts are arrayed over an area of the top surface of the sheet with spaces therebetween so that heat transferred from the microelectronic device to the bottom surface of the sheet may be transferred to the multiplicity of thermally conductive posts.

BRIEF DESCRIPTION OF THE DRAWING

FIGS. 5A and 5B are perspective and cross sectional views, respectively, of a thermally conductive post adapted to allow vertical circulation of cooling fluid;

FIG. 5C is a perspective view of an array of thermally conductive posts mutually aligned so as to facilitate vertical flow of cooling fluid;

DETAILED DESCRIPTION

Figure 1A:
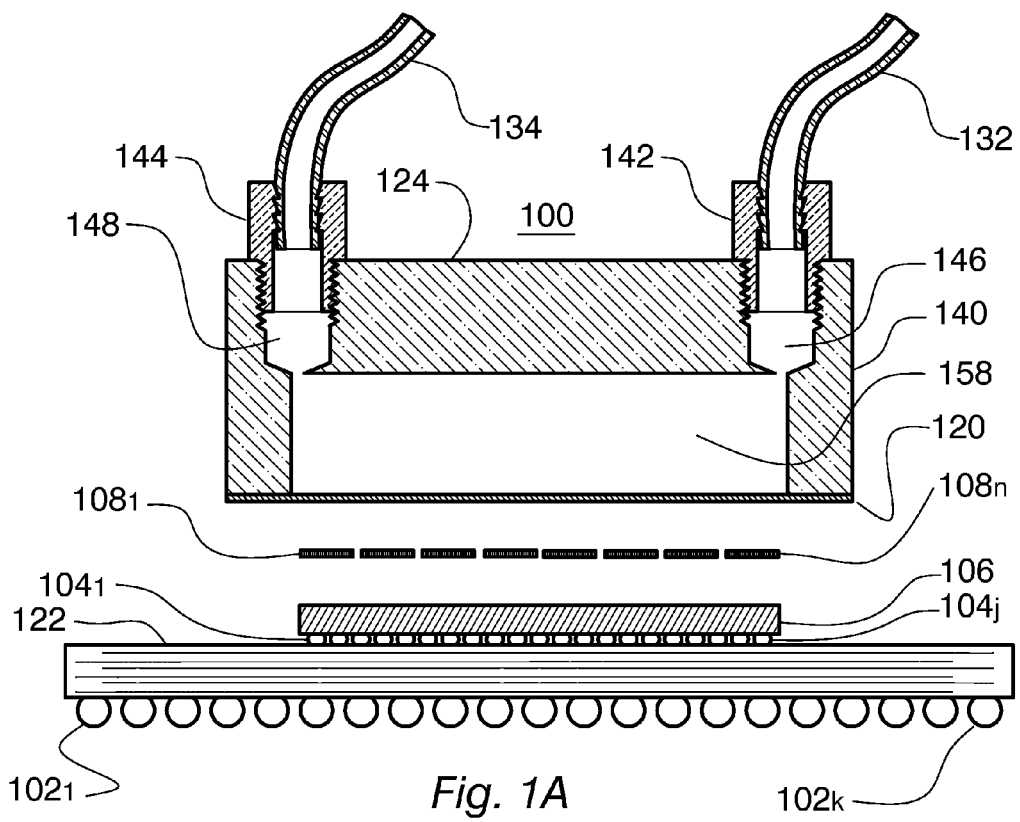
FIG. 1A is an exploded assembly cross sectional view and FIG. 1B is a cross sectional view showing internal construction details, respectively, of an apparatus for cooling microelectronic devices that is fabricated in accordance with one or more embodiments of the present invention.

FIGS. 1A, 1B, 4 and 7 show aspects and operation of a heat sink for cooling semiconductor devices (also referred to herein as chips or semiconductor chips) that is fabricated in accordance with one or more embodiments of the present invention. FIG. 1A is an exploded assembly view of system 150 shown in FIG. 1B. As shown in FIG. 1A, rigid support ring 140 supports thermally conductive sheet 120. It should be understood that the term support ring is not meant to limit embodiments of the present invention to configurations where a support ring refers to a structure having a generally circular shape. In fact, it is within the scope of the present invention that embodiments exist wherein support ring 140 refers to any support structure having a peripheral support portion with an empty area within the peripheral portion where the peripheral support structure may, for example and without limitation, be rectangular. In accordance with one or more embodiments of the present invention, support ring 140 is made of an iron-nickel alloy 36 (invar), and, in accordance with other embodiments, support ring 140 may be made of copper, brass, kovar, aluminum nitride ceramic, glass ceramic, aluminum oxide or any low expansion rigid material. In accordance with one or more embodiments of the present invention, the material used to fabricate rigid support ring 140 (i.e., the ring material) is selected, apart from its ability to provide rigid support, for its coefficient of thermal expansion (CTE). For example, in an application of apparatus 100 as a heat sink to cool a semiconductor integrated circuit by attachment of apparatus 100 directly to the chip, the ring material is preferably selected to have a low CTE. For example, a ring material of invar, kovar or aluminum nitride is preferable for applications wherein apparatus 100 is used as a heat sink to cool a silicon chip that is attached directly thereto. In accordance with one or more embodiments of the present invention, rigid support ring 140 is preferably between 1.0 mm and 15.0 mm thick, for example and without limitation, rigid support ring may be 5.0 mm thick.

As further shown in FIG. 1A, thermally conductive sheet 120 is attached to the bottom surface of rigid support ring 140. Attachment of sheet 120 to ring 140 is by means of brazing, welding, diffusion bonding, and other means of making a mechanically strong bond. In accordance with one or more embodiments of the present invention, the material used to fabricate sheet 120 (i.e., the sheet material) is selected for its thermal conductivity (a high thermal conductivity being preferred) and for its mechanical tensile strength. For example, in an application of apparatus 100 as a heat sink to cool a semiconductor device by attachment of apparatus 100 directly to the device, the sheet material may be a beryllium-copper spring alloy ASTM B534 or it may be preferably selected from a group including sterling silver, coin silver, phosphor bronze, and various copper alloys such as alloy 186

(available from Olin Brass Company of Bridgeport, Conn.), and copper alloy ASTM B422. In normal operation, sheet 120 is held in tension by rigid ring 140. In accordance with one or more embodiments of the present invention, sheet 120 is preferably thin, for example and without limitation, having a thickness between 25 and 250 micrometers.

As further shown in FIG. 1A, in accordance with one or more embodiments of the present invention, cooling fluid is channeled into intake port 142 on heat sink 100 by tubing 132 connecting heat sink 100 to a circulating chiller system (not shown). Cooling fluid flows through heat sink 100 and out of exit port 144 to tubing 134 that carries the fluid back to the circulating chiller system. A sealed volume enclosed by sheet 120, rigid ring 140 and enclosure 124 forms channel 158 for conducting the cooling fluid from manifold 146 connected intake port 142 to manifold 148 connected to exit port 144. Cooling fluid flowing in channel 158 exchanges heat with thermally conductive sheet 120, which in turn is thermally connected to semiconductor device 106 by an array of thermal interface materials $108_1$-$108_n$. The thermal interface materials $108_1$-$108_n$ preferably have a high thermal conductivity and a small thickness in order to provide a path of low thermal resistance between sheet 120 and device 106.

Figure 1B:
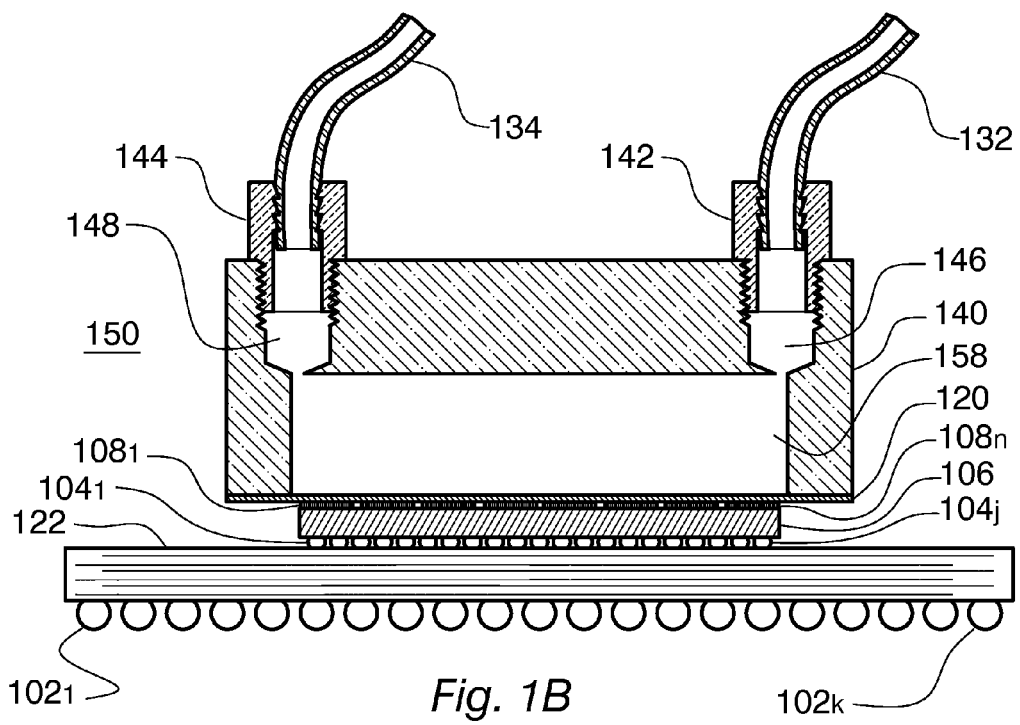

Heat sink 100 is mounted to a semiconductor device 106 as in FIG. 1B in order to cool the device effectively. In a typical application, device 106 is a silicon flip chip attached to a ball grid array (BGA) substrate 122 by an array of solder balls $104_1$-$104_j$. BGA substrate 122 is provided with an array of solder balls $102_1$-$102_k$ for attachment to a system board. Die attach materials $108_1$-$108_n$ attach device 106 mechanically and thermally to heat sink 120. Die attach materials $108_1$-$108_n$ are preferably thin and highly thermally conductive. Materials of high thermal conductivity include but are not limited to $Au_{20}Sn_{20}$ alloy, Au—Ge alloy, Au—Si alloy, silver filled epoxy, tin-silver alloys, indium, indium alloys, and other high conductivity alloys.

FIGS. 2A, 2B, 3A and 3B show the use of thermally conductive posts to increase thermal transfer from a cooling fluid to a thermally conductive sheet. As shown if FIG. 2A, an array of thermally conductive posts $160_1$-$160_n$ is positioned in slidable contact with sheet 120. Cooling fluid flows in the spaces between posts $160_1$-$160_n$, transferring heat between the posts and the cooling fluid. Heat is then conducted along the length of the post to or from the sheet. In accordance with one or more embodiments of the present invention, posts $160_1$-$160_n$ are round or square in cross section. Of course, those of ordinary skill in the art should understand that further embodiments exist (as will be described below) in which posts $160_1$-$160_n$ may have other shapes, for example and without limitation, more complex shapes, that also provide, or even improve, thermal contact with a cooling fluid. In accordance with one or more embodiments of the present invention, posts $160_1$-$160_n$ are in thermal contact with sheet 120. In particular, and in accordance with one or more such embodiments of the present invention, each of posts $160_1$-$160_n$ is in thermal contact with (for example and without limitation by being in slidable contact with) thermally conductive sheet 120 to conduct heat from sheet 120 through the posts to cooling fluid circulating around the posts. In further particular, and in accordance with one or more such embodiments of the present invention, posts $160_1$-$160_n$ are disposed with spaces therebetween to enable passage of a cooling fluid. For example, in accordance with one embodiment, posts $160_1$-$160_n$ are copper alloy ASTM B152 cylinders that are diffusion bonded directly to enclosure 140. Further, in accordance with another embodiment, posts $160_1$-$160_n$ are compliantly attached to sheet 120 by means of solder, adhesive or other bonding material to form a thermal contact therebetween.

Figure 2A:
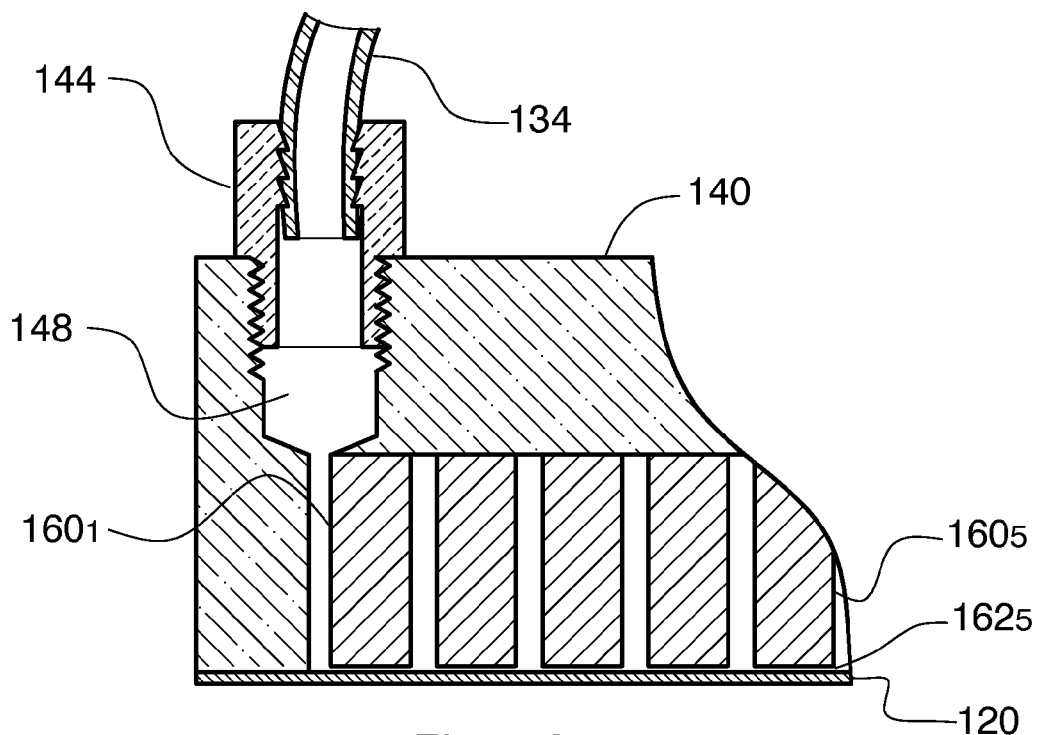
FIG. 2A is a partial cross sectional view of an apparatus adapted for cooling microelectronic devices in accordance with one or more embodiments of the present invention, wherein thermally conductive posts are in slidable contact with a thermally conductive sheet.
Figure 2B:
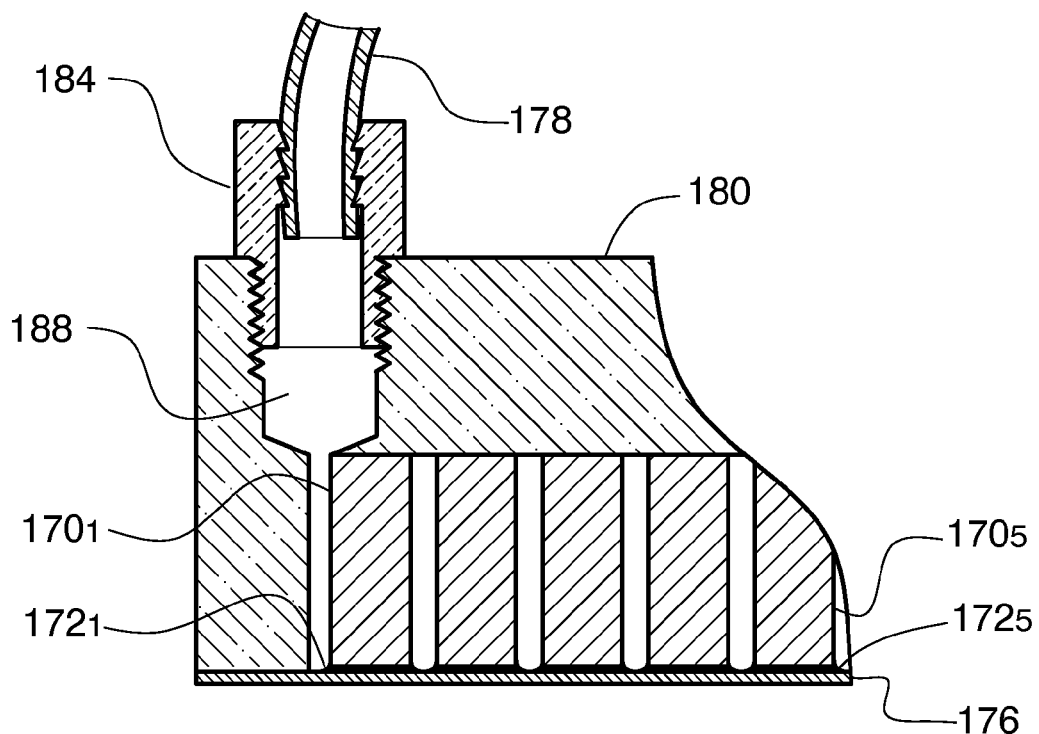
FIG. 2B is a partial cross sectional view of an apparatus adapted for cooling microelectronic devices in accordance with one or more embodiments of the present invention, wherein thermally conductive posts are permanently joined to the top surface of a sheet.
Figure 3A:
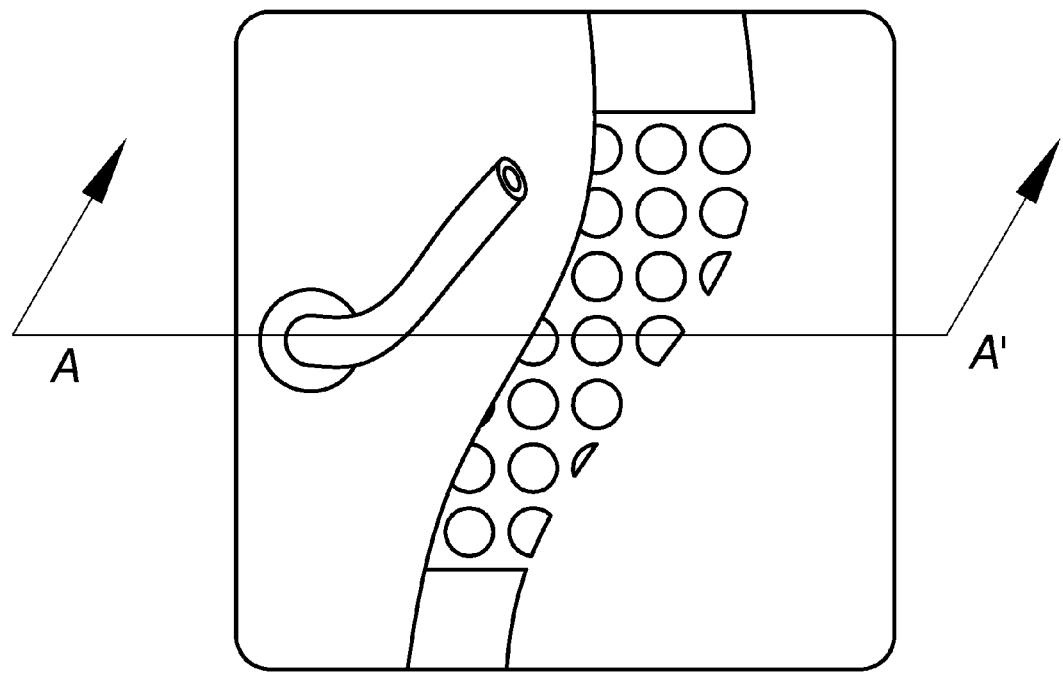
FIG. 3A is a cutaway view of a top of an apparatus adapted for cooling microelectronic devices in accordance with one or more embodiments of the present invention.
Figure 3B:
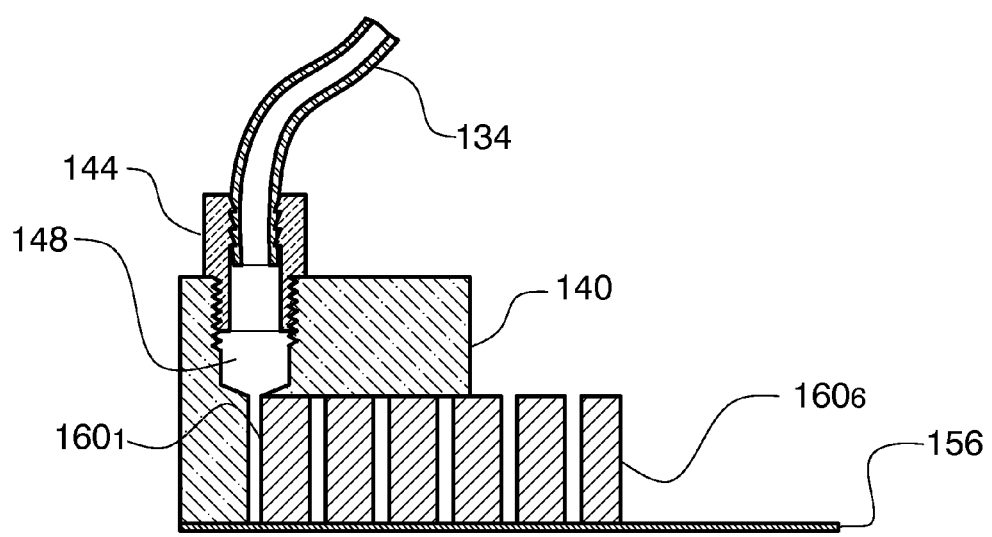
FIG. 3B is a partial cross sectional view along section A-A' of a portion of the apparatus shown in FIG. 3A which shows details of a thermally conductive sheet held by a rigid ring.

FIG. 2B is a cross sectional view of a portion of an apparatus that is fabricated in accordance with one or more embodiments of the present invention and that uses sheet 176. Conductive posts, for example, conductive posts $170_1$-$170_n$, are attached at a top end to enclosure 180, and at bottom ends $172_1$-$172_n$ to thermally conductive sheet 176. The bottom end or each of posts $170_1$-$170_n$ is attached to sheet 176 by brazing, soldering, diffusion bonding, adhesive or other joining means.

Figure 4:
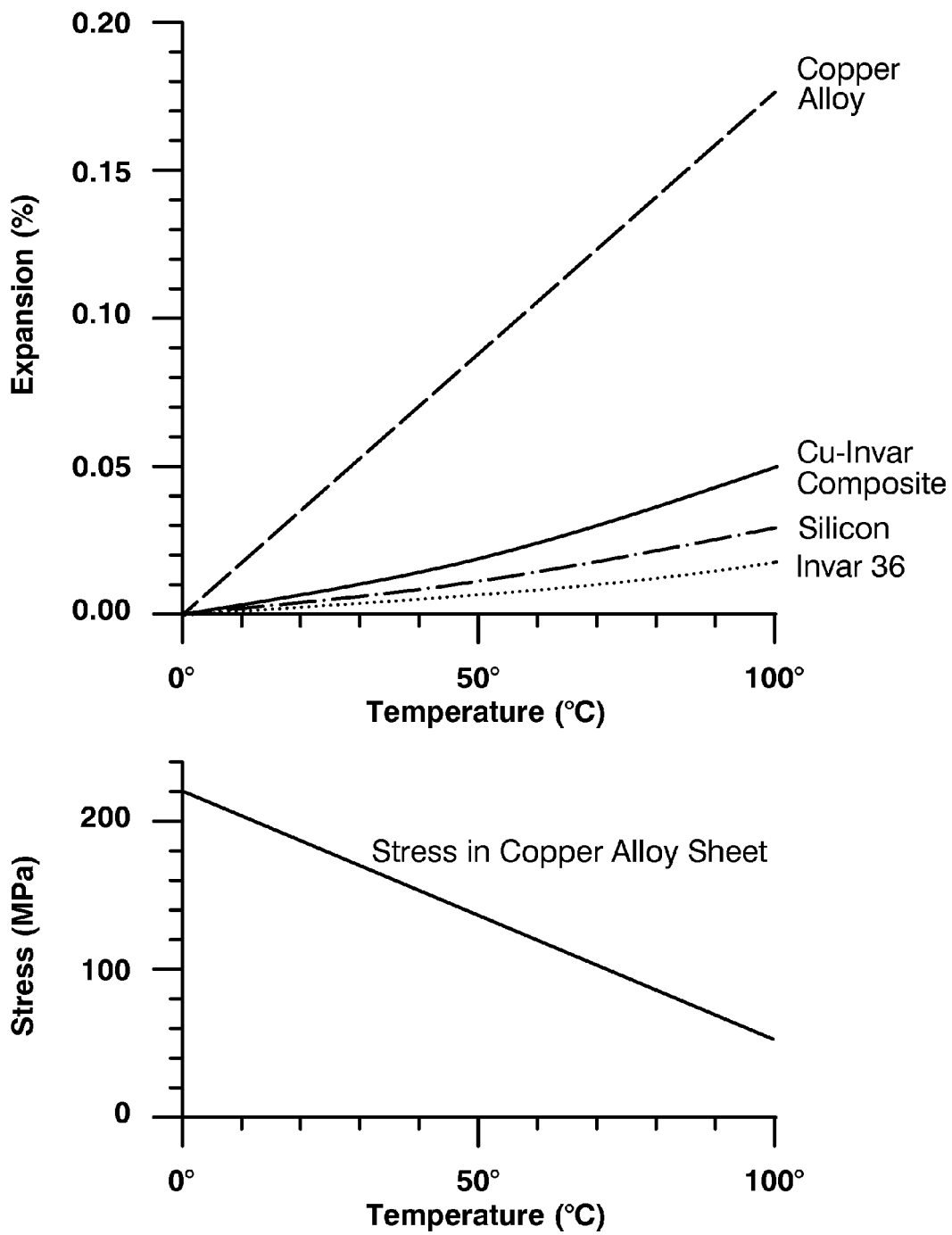
FIG. 4 is a graphical representation of thermal expansion as a function of temperature of materials including a copper alloy, invar 36, silicon and an assembly of a copper sheet to an invar ring, and of the stress in the copper alloy sheet as a function of temperature.

In the conventional art of chip cooling, die attach materials are necessarily mechanically compliant in order to decouple thermal stresses induced by a differential thermal expansion between a heat sink and an attached device. The conventional art teaches a tradeoff between the thermal conductance and mechanical compliance of die attach materials is required to achieve an acceptable thermal cooling performance at an acceptable level of reliability. According to principles of the present invention, as illustrated in FIG. 4, the tradeoff between thermal conductance and reliability is relieved in favor of higher thermal conductance by minimizing stress caused by differential expansion of heat sink 100 relative to semiconductor device 106. FIG. 4 shows expansion of various materials as they are heated from a starting temperature of 0° C.: Copper Alloy of sheet 120 (such as alloy 7025 available from Olin Brass of Bridgeport, Conn.), Silicon of device 106, Invar "36" of ring 140, and Cu-Invar Composite sheet 120 as constrained by ring 140. It is seen that Copper Alloy expands much more rapidly than Silicon with an increase in temperature from 0° C. to 100° C. If a Silicon device were attached rigidly to a Copper Alloy sheet, differential expansion would stress the interface between the two, leading over time to cracking and failure. One or more advantages of the present invention are seen in FIG. 4 which shows that the differential in expansion between a Silicon device 106 and a Cu-Invar Composite of sheet 120 attached to ring 140 is reduced significantly. In order to achieve a reduced thermal expansion in the Cu-Invar composite, high conductivity sheet 120 is rigidly attached to ring 140, around a perimeter of sheet 120, so that sheet 120 is in tension at an initial temperature of 0° C. By way of example, beryllium-copper alloy 172 is under no stress at 280° C. after attachment to an invar ring by gold-tin solder. Differential expansion between the copper alloy sheet and the invar induces a 0.4% strain in the foil when cooled to room temperature, with a corresponding stress of approximately 590 mega-Pascal. Stress in the Copper Alloy Sheet 120 is shown as a function of temperature in FIG. 4. As assembly 100 is heated, thermal expansion of sheet 120 acts to reduce the tensile stress in the sheet. The reduction of stress in sheet 120 with temperature acts to counter thermal expansion of the sheet, resulting in a reduction of the global or macroscopic effective coefficient of thermal expansion of the composite of sheet 120 and ring 140. Sheet 120, when constrained by low expansion ring 140, has a lower expansion coefficient than an unconstrained sheet of the same high thermal conductivity material as sheet 120. The reduced macroscopic effective thermal coefficient of expansion of sheet 120 allows the sheet to be bonded rigidly to a semiconductor device 106 in order to achieve a high thermal conductance bond therebetween.

FIGS. 5A, 5B and 5C show thermally conductive posts that are fabricated in accordance with one or more embodiments of the present invention that enhance thermal transfer to a cooling fluid. As shown in the perspective view of FIG. 5A, thermally conductive post 240 comprises a tube having a hollow core and holes 242 and 246 disposed in a wall of the tube. In accordance with one or more embodiments of the present invention, holes 242 and 246 allow cooling fluid to circulate into the tube, increasing surface area in contact with the cooling fluid and thereby increasing transfer of heat from post 240 to the cooling fluid. As seen in the cross sectional view FIG. 5B, cooling fluid enters hole 242 proximal to top end 244 of post 240, and flows downwardly inside the cylindrical tube to a hole 246 distal from top end 244 of post 240. Holes 242 and 246 are oriented with respect to the fluid flow so as to favor flow into hole 242 oriented in an upstream direction and out of hole 246 oriented in a downstream direction. In order to facilitate flow of cooling fluid vertically through the post, hole 242 proximal to top end 244 is disposed on post 240 on a side opposite to hole 246. More preferably, hole 242 is at an angle of between 90° and 270° with respect to hole 246 when viewed along the axis of post 240. In a heat sink in accordance with one or more embodiments of the present invention, as shown in FIG. 5C, tubular posts $240_1$-$240_s$ are disposed in an array on a thermally conductive sheet (not shown) with an orientation such that each of holes $242_1$-$242_s$—holes $242_1$-$242_s$ are proximal to top ends $244_1$-$244_s$ of posts $240_1$-$240_s$, respectively—is oriented in an upstream direction with respect to flow of cooling fluid. Correspondingly, each of holes $246_1$-$246_s$—holes $246_1$-$246_s$ are distal from top ends $244_1$-$244_s$ of posts $240_1$-$240_s$, respectively—is oriented in a downstream direction with respect to flow of cooling fluid. Cooling fluid flowing through an array of posts as shown in FIG. 5C will flow in part into holes $242_1$-$242_s$ proximal to top ends $244_1$-$244_s$ of posts $240_1$-$240_s$, respectively, causing fluid to flow downward inside each of the cylindrical tubes of posts $240_1$-$240_s$ and, thereby, mixing cooling fluid flowing along the top of the array of tubes with fluid flowing along the bottom of the array of tubes. This mixing and vertical flow enhances thermal transfer between the cooling fluid and the thermally conductive sheet (not shown) attached thereto. A thermally conductive sheet may be attached to top ends $244_1$-$244_s$ of each of tubes $240_1$-$240_s$, or to the opposite ends of the tubes. An appropriate number, size, and positioning of holes may be determined by one of ordinary skill in the art routinely and without undue experimentation.

Figure 6A:
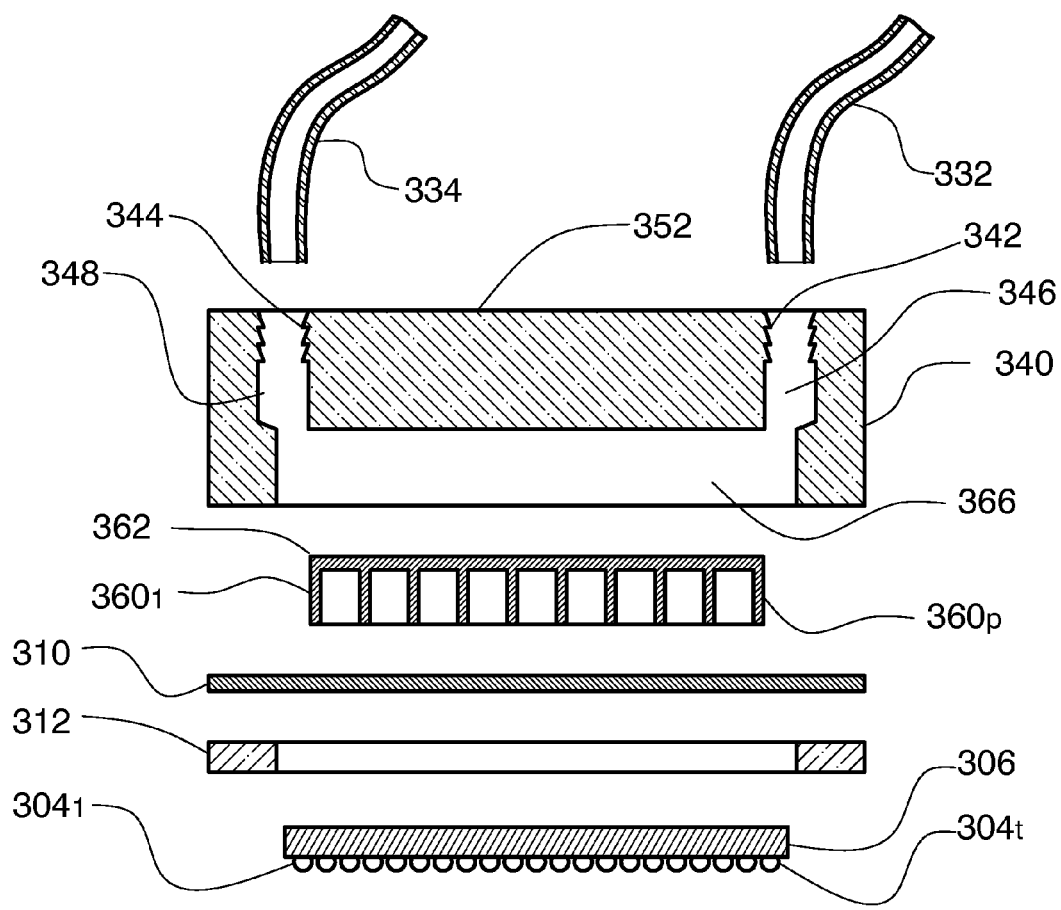
FIG. 6A is an exploded assembly cross sectional view and FIG. 6B is a cross sectional view of an apparatus for cooling microelectronic devices that is fabricated in accordance with one or more embodiments of the present invention, which figures show fluid flow baffles adapted to channel flow of cooling fluid over the top surface of a thermally conductive sheet.
Figure 6B:
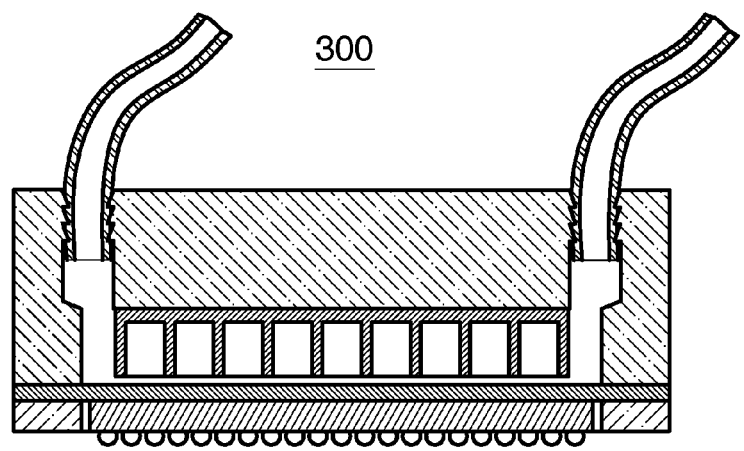

As further shown in FIGS. 6A and 6B, in accordance with one or more embodiments of the present invention, baffle 362 is inserted in channel 366 of heat sink 300 in order to lengthen the flow path of cooling fluid in the channel. In further addition, ribs $360_1$-$360_p$ on baffle 362 act to conduct heat vertically away from thermally conductive sheet 310 and into cooling fluid flowing in channel 366. Baffle 362 is attached to enclosure 352 and slidably contacts sheet 310. According to principles of the present invention, sheet 310, comprising thermally conductive material such as copper alloy 7025, is rigidly attached to ring 340 comprising low thermal expansion material such as Invar 36. An additional ring 312 of low thermal expansion material may be attached to a bottom surface of sheet 310 in order to provide additional constraint. In heat sink assembly 300, additional ring 312 lies outside the perimeter of semiconductor device 306. Preferably, the thickness of additional ring 312 is less than the sum of the thickness of device 306 and an array of solder balls $304_1$-$304_t$ on the bottom surface of device 306. Cooling fluid is conducted into intake manifold 346 of heat sink 300 by tubing 332. Heat sink 300 is adapted to allow cooling fluid to flow from intake manifold 346, through baffle 362 in channel 366, and out through exhaust manifold 348. Tubing 334 conducts cooling fluid away from exhaust manifold 348. Tubing 332 and 334 are attached and sealed to enclosure 352 by means of internal barbs 342 and 344 in manifolds 346 and 348, respectively.

Figure 7:
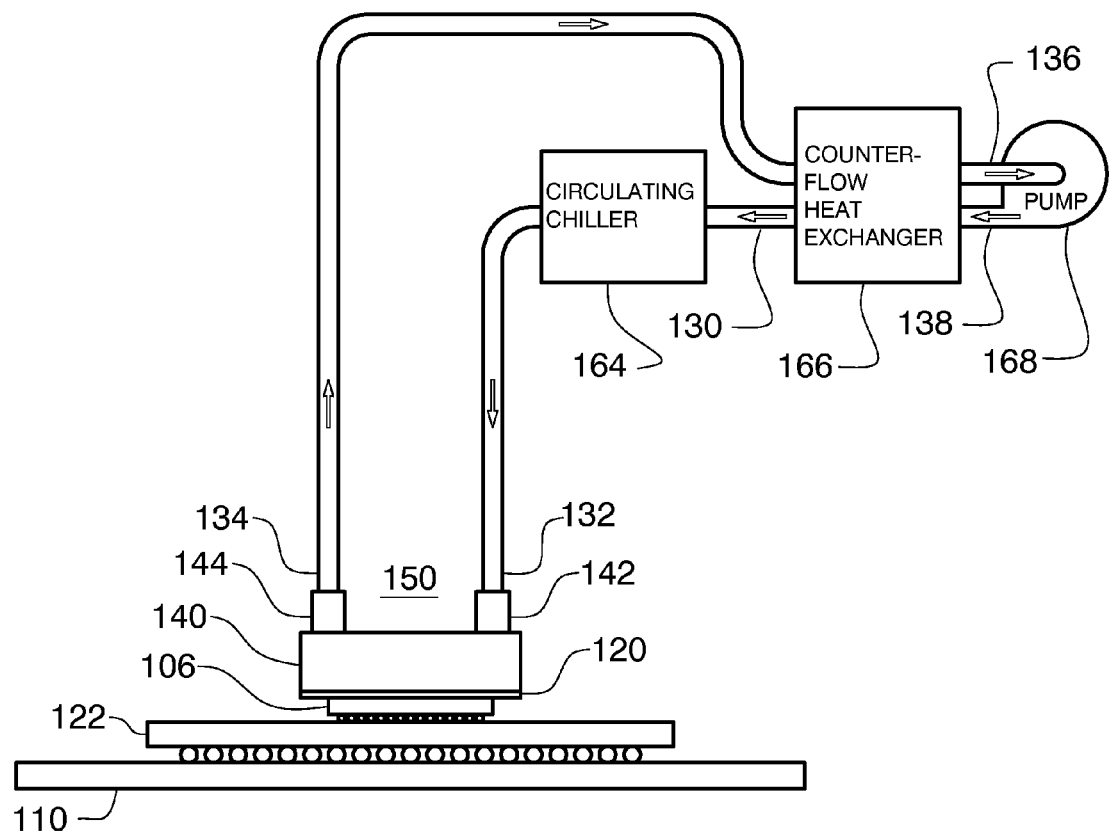
FIG. 7 is a schematic representation of system for fluid cooling a microelectronic device attached to a heat sink that is fabricated in accordance with one or more embodiments of the present invention.

FIG. 7 shows a microelectronic assembly 150 that is fabricated in accordance with one or more embodiments of the present invention for cooling high power semiconductor devices. As shown in FIG. 7, semiconductor device 106 is attached directly to the thermally conductive sheet 120 by means of die attach material (shown as material 108 in FIGS. 1A and 1B). As further shown in FIG. 7, microelectronic assembly 150 is mounted on daughter card 122 which is, in turn, attached to system board 110.

In operation, heat generated in device 106 is conducted through thermally conductive sheet 120 to a cooling fluid flowing in contact with sheet 120. Cooling fluids may be gases, liquids, two phase refrigerants and other fluids. For example, and without limitation, cooling fluids well known in the art include air, helium, water, water-glycol mixtures, GALDEN LS/155 (available from Solvay Solexis, Inc.), FLUORINET FC-77 (available from 3M Corporation), SU-95 refrigerant (available from DuPont Corporation), R404A refrigerant (available from DuPont Corporation), and others. The cooling fluid enters enclosure 140 through intake port 142 from a fluid flowing in tubing 132 from a circulating system. After exchanging heat with thermally conductive sheet 120, the fluid flows out of enclosure 140 through exit port 144 and returns back to a circulating system through tubing 134. Return cooling fluid in tubing 134 is coupled through counterflow heat exchanger 166 and thence through tubing 136 back to pump 168. Cooling fluid pressurized by pump 168 is directed by tubing 138 through counterflow heat exchanger 166 where heat from return fluid in tubing 134 is transferred to fluid in tubing 138 from pump 168. Pressurized cooling fluid from counterflow heat exchanger 166 is channeled by tubing 130 to circulating chiller 164, whereby the cooling fluid is brought to a set temperature and thence routed back through tubing 132 back to enclosure 140.

Operation of circulating cooling fluid systems and chillers are well known in the art, and such systems may be fabricated in accordance with any one of a number of methods that are well known to those of ordinary skill in the art. Further, in light of the detailed described provided herein, one of ordinary skill in the art can readily determine how such systems may be used in conjunction with mechanically compliant thermal heat sinks that are fabricated in accordance with one or more embodiments of the present invention.

In normal operation of microelectronic system 150, semiconductor device 106 will undergo cycles of heating and cooling that induce mechanical expansion and contraction of thermally conductive sheet 120. Thermally induced expansion and contraction of sheet 120 with respect to semiconductor device 106 induces stress in joining layer features $108_1$-$108_n$, thereby inducing failure of the system operating in on-off cycles over a period of time. Upon heating, expansion of the material comprising thermally conductive sheet 120 is typically larger than expansion of semiconductor device 106. By way of example, material of sheet 120 may be copper with an coefficient of thermal expansion (CTE) of 17.7 parts per million per ° C., while material of device 106 may be silicon with a CTE of about 2.8 parts per million per ° C. For a temperature rise of 100° C., sheet 120 expands 14.9 microns more than device 106 attached thereto for every centimeter of size of device 106. The relative differential thermal expansion between sheet 120 and device 106 will fatigue and fracture in the connection therebetween (shown as layer features $108_1$-$108_n$ in FIGS. 1A and 1B) after repeated temperature cycling. By stretching sheet 120 over ring low expansion ring 140 (shown in FIGS. 1A and 1B), the effective macroscopic coefficient of thermal expansion of sheet 120 is reduced, thereby significantly increasing the reliability of microelectronic system. Although the reliability of system 150 depends upon choice of material joining device 106 to sheet 120, the mean time to failure is assumed to be proportional to the difference between $CTE_D$ of device 106 and $CTE_S$ of sheet 120 taken to the power of −2. That is, $t_{failure} = K (CTE_S - CTE_D)$, where K is a proportionality coefficient. Constraint of sheet 120 by enclosure 140 acts to reduce $CTE_S$ and, thereby, increase time to $t_{failure}$. By way of example, a reduction of $CTE_S - CTE_D$ to an amount 71% of the original results in a doubling of time to failure $t_{failure}$ and a significant improvement is system reliability. Although the example given illustrates the advantages of embodiments of the present invention in improving the reliability of microelectronics assemblies, the specific improvement in time to failure will depend upon details of materials and construction.

Figure 8:
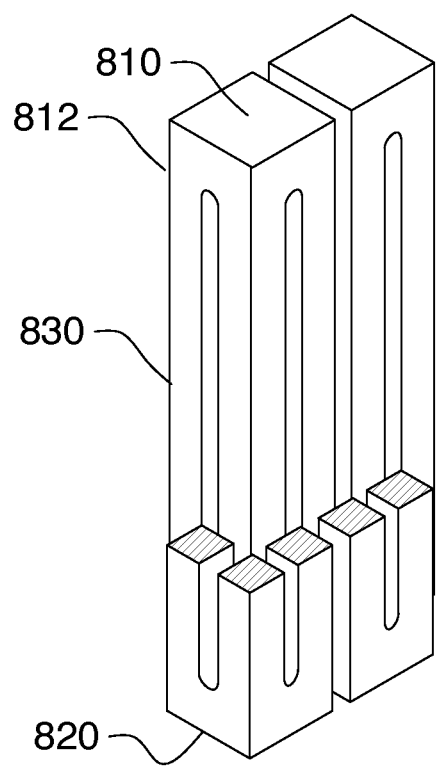
FIG. 8 is a partial sectional view of an array of thermal posts.

FIG. 8 shows a partial sectional view of an array of thermal posts 812 adapted to join faces 810 to a first surface, and to join faces 820 to a second surface. Each face 810 rests on four posts 830, where each of faces 810 is linked to an opposite face 820 by one post 830. The array of thermal posts 812 is useful as thermally conductive posts $170_1$-$170_5$ of FIG. 2B, posts $160_1$-$160_6$ of FIG. 3B, and posts $940_1$-$940_n$ of FIG. 9A.

Figure 9A:
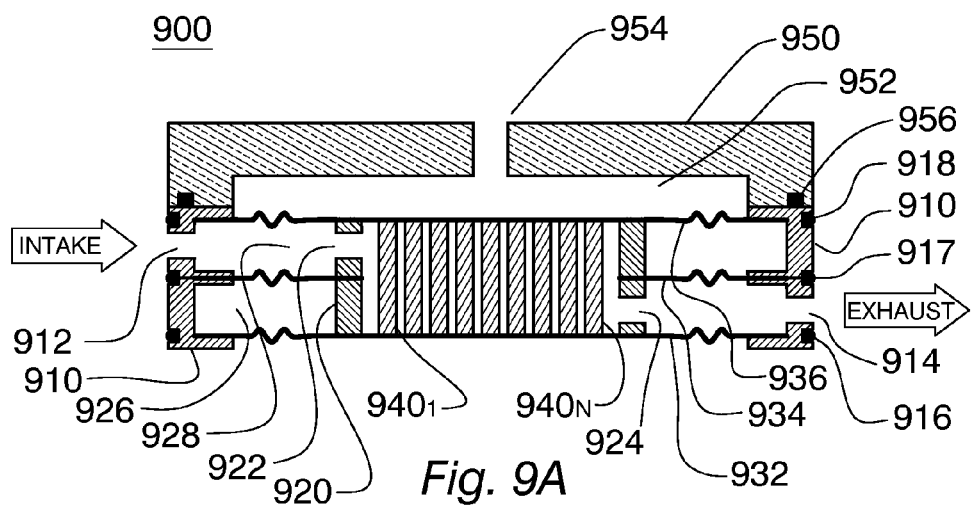
FIG. 9A is a cross sectional view of a pneumatically actuated cooling head in a retracted state.
Figure 9B:
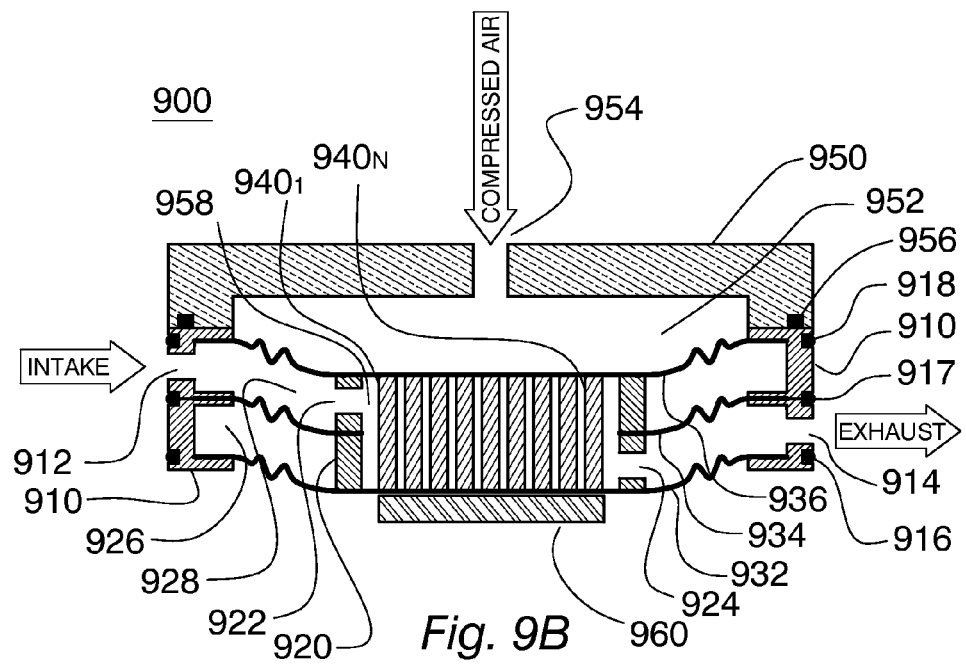
FIG. 9B is a cross sectional view of a pneumatically actuated cooling head in an extended state.

FIGS. 9A and 9B show a pneumatically actuated head 900 for cooling an electronic device, in a retracted state and in an extended state, respectively. Outer ring 910 of head 900 is perforated by intake aperture 912 to allow cooling fluid to flow into the head. Flexible diaphragms 932, 934 and 936 are attached to outer ring 910, whereby fluid channel 926 is formed between flexible diaphragms 932 and 934, and fluid channel 928 is formed between flexible diaphragms 934 and 936. Flexible diaphragms 932, 934 and 936 are also attached to inner ring 920. Aperture 922 through inner ring 920 is disposed to allow fluid to flow into intake aperture 912, along fluid channel 928 to aperture 922, and thence through aperture 922 into cooling chamber 958 (refer to FIG. 9B). Aperture 924 through inner ring 920 is disposed to allow fluid to flow out of cooling chamber 958, along fluid channel 926 to aperture 914 in outer ring 910, and thence out through exhaust aperture 914.

Heat is conducted between device 960 and the thermal transfer fluid flowing through head 900. Thermal transfer fluid flows into intake aperture 912 and along channel 928 to enter cooling chamber 958 through aperture 922. The thermal transfer fluid flows around thermally conductive pins $940_1$-$940_N$ in cooling chamber 958, affecting a thermal exchange between the fluid and the pins. Heat is exchanged between pins $940_1$-$940_N$ and device 960 by conduction through flexible diaphragm 932. The temperature of device 960 is set and controlled by regulating the temperature of thermal transfer fluid flowing into the intake and out of the exhaust of head 900.

In operation, flexible diaphragm 932 is urged against a surface of device 960 by application of a fluid under pressure such as compressed air through aperture 954 in manifold 950. Fluid pressure acts upon diaphragm 936 to move the diaphragm in a direction toward device 960. Force is transmitted from diaphragm 936 through pins $940_1$-$940_N$ and onto diaphragm 932. Force exerted by diaphragm 932 onto device 960 can be set and controlled by regulating pressure of the fluid introduced through aperture 954.

In one or more embodiments of the invention, flexible diaphragms 932, 934 and 936 are silver alloy foil, and pins $940_1$-$940_N$ are silver cylinders of length 7 mm. Pins $940_1$-$940_N$ are arrayed over a surface of diaphragm 932, preferably in a square array or in a honeycomb pattern. Inner ring 920 and outer ring 910 are copper rings of height 7 mm. Outer ring 910 is provided with O-rings 916, 917 and 918 disposed to seal to a manifold (not shown) for conduction of thermal transfer fluid into intake port 912 and out of exhaust port 914. Manifold 950 is sealed to flexible diaphragm 936 by O-ring 956 to form an enclosed cavity 952 to contain fluid introduced into aperture 954, thereby allowing a hydrostatic pressure to urge flexible diaphragm 936 downward. Manifold 950 is, by way of example, fabricated from a polymer such as Torlon® (available from Solvay Specialty Polymers).

Diaphragm 934 acts as a baffle that separates thermal transfer fluid flowing into intake aperture 912 from thermal transfer fluid flowing to exhaust aperture 914. Alternative baffles located between intake aperture 912 and exhaust aperture 914 can be used in place of diaphragm 934 to keep separate the intake fluid from the exhaust fluid. In one or more embodiments, inner ring 920 is not required for separation of intake and exhaust fluids.

One of more embodiments of the present invention described above are exemplary. Many changes and modifications may be made to the disclosure recited above while remaining within the scope of the invention. For example, although the specification has described embodiments wherein a thermally conductive sheet is held under tension by a rigid ring of low CTE, further embodiments of the present invention are not limited to the use of flat sheets. In fact, it is within the scope of the present invention that further embodiments exist wherein thermally conductive sheets may have slots, bosses, bumps, and posts for increasing thermal transport between the cooling fluid and the sheet. For example, an array of wire like posts may be disposed over the top surface of the sheet so as to couple thermally the cooling fluid to the sheet. In addition, although above-described embodiments have related to cooling of semiconductor devices, such devices may be heated if the circulating fluid were heated. In such a case, the above-described embodiments could be used to transfer heat to semiconductor devices. The scope of the invention should therefore be determined not with reference to the above description, but instead should be determined with reference to the appended claims along with their full scope of equivalents.

What is claimed is:

1. A heat sink apparatus for cooling a microelectronic device comprising:
    a closed chamber with a bottom sheet, an intake port and an exhaust port;
    a fluid channel through said chamber, said channel connecting said intake port to said exhaust port; and
    two or more hollow cylindrical posts disposed in an array over said bottom sheet;
    each of said posts having a top end and a bottom end, wherein each bottom end is in thermal contact with said bottom sheet;
    wherein each of said hollow cylindrical posts is pierced by a first hole through a wall of said cylinder proximal to said top end; and
    wherein each of said hollow cylindrical posts is pierced by a second hole through the wall of said cylinder proximal to said bottom end.

2. The heat sink apparatus of claim 1 wherein a center of said first hole is offset from a center of said second hole by an angle of between 30° and 330° with respect to the axis of said hollow cylindrical post.

3. The heat sink apparatus of claim 1 configured so that a portion of a cooling fluid flowing through said channel flows through each of said hollow cylindrical posts, thereby mixing cooling fluid flowing distal from said sheet with cooling fluid flowing proximal to said sheet.

4. A head for transfer of heat from a fluid to a device, the head comprising:
- an outer ring with a first and a second surface;
- an inside surface of a first flexible diaphragm attached to the first surface of the outer ring;
- an inside surface of a second flexible diaphragm attached to the second surface of the outer ring;
- an array of thermally conductive pins arrayed over the inside surface of the second diaphragm;
- wherein each of the pins is attached at a first end to the inside surface of the first diaphragm and at a second end to the inside surface of the second diaphragm;
- wherein the outer ring is pierced therethrough by an intake aperture and by an exhaust aperture;
- a manifold sealed to the head thereby forming a sealed chamber wherein the first flexible diaphragm forms a wall of the sealed chamber; and
- an outer surface of the second diaphragm adapted to contact the device;
- whereby gas pressure applied to the sealed chamber acts to urge the second diaphragm in a direction away from the sealed chamber.

* * * * *